(12) United States Patent
Ikegami

(10) Patent No.: US 8,498,989 B2
(45) Date of Patent: Jul. 30, 2013

(54) MASS ANALYSIS DATA PROCESSING METHOD AND MASS SPECTROMETER USING THE SAME

(75) Inventor: Masahiro Ikegami, Takaishi (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 13/396,478

(22) Filed: Feb. 14, 2012

(65) Prior Publication Data

US 2012/0209854 A1 Aug. 16, 2012

(30) Foreign Application Priority Data

Feb. 16, 2011 (JP) .................................. 2011-030829

(51) Int. Cl.
*G06F 17/30* (2006.01)

(52) U.S. Cl.
USPC ............. 707/744; 707/661; 707/736; 702/23; 341/87

(58) Field of Classification Search
None
See application file for complete search history.

(56) References Cited

U.S. PATENT DOCUMENTS

| | | | | |
|---|---|---|---|---|
| 6,008,490 | A * | 12/1999 | Kato | 250/282 |
| 6,378,007 | B1 * | 4/2002 | Southwell | 710/1 |
| 6,784,422 | B2 * | 8/2004 | Covey et al. | 250/285 |
| 7,075,064 | B2 * | 7/2006 | Oliphant et al. | 250/281 |
| 2004/0102906 | A1 * | 5/2004 | Roder | 702/22 |
| 2008/0129607 | A1 * | 6/2008 | Zwick et al. | 343/702 |
| 2009/0294645 | A1 * | 12/2009 | Gorenstein et al. | 250/282 |
| 2010/0187414 | A1 * | 7/2010 | Gorenstein et al. | 250/282 |
| 2010/0309031 | A1 * | 12/2010 | Kawato | 341/87 |
| 2012/0133532 | A1 * | 5/2012 | Hunt et al. | 341/87 |

FOREIGN PATENT DOCUMENTS

| | | |
|---|---|---|
| JP | 2007-103982 | 4/2007 |
| WO | WO 2009/069225 A1 | 11/2007 |

OTHER PUBLICATIONS

Beagley et al, "Increasing the Efficiency of Data Storage and Analysis Using Indexed Compression", IEEE, 2009.*
Miguel et al, "Compression of LC/MS Proteomic Data", 2006.*
Reichenbach et al "Efficient encoding and rapid decoding for interactive visualization of large three-dimensional hyperspectral chemical image", 2009.*
Kiyoshi Ogawa et al., "Research and Development of Mass Microscope", Shimadzu Review, Mar. 31, 2006, vol. 62, Nos. 3-4, pp. 125-135.
Takahiro Harada et al., "Biological Tissue Analysis Using Mass Microscope", Shimadzu Review, Apr. 24, 2008, vol. 64, Nos. 3-4, pp. 139-146.

* cited by examiner

*Primary Examiner* — Hung Le
(74) *Attorney, Agent, or Firm* — Bingham McCutchen LLP

(57) ABSTRACT

Provided is a method for quickly obtaining an intensity value at a desired m/z value in a compressed data obtained by run-length encoding of a mass analysis data. An index is created by pairing either the start position of a section where zero-intensity consecutively occurs two or more times in an array of an original spectrum data, or the start position of a sequence of data having significant intensity values in an array of the original spectrum data, with the corresponding position in an array of a compressed data. This index is stored separate from the compressed data. The creation of the index does not affect the array of the compressed data. Therefore, the data can be decompressed even by a data processing system that does not use the index. The index helps to quickly locate a compressed data corresponding to the desired m/z and obtain the necessary intensity value.

15 Claims, 8 Drawing Sheets

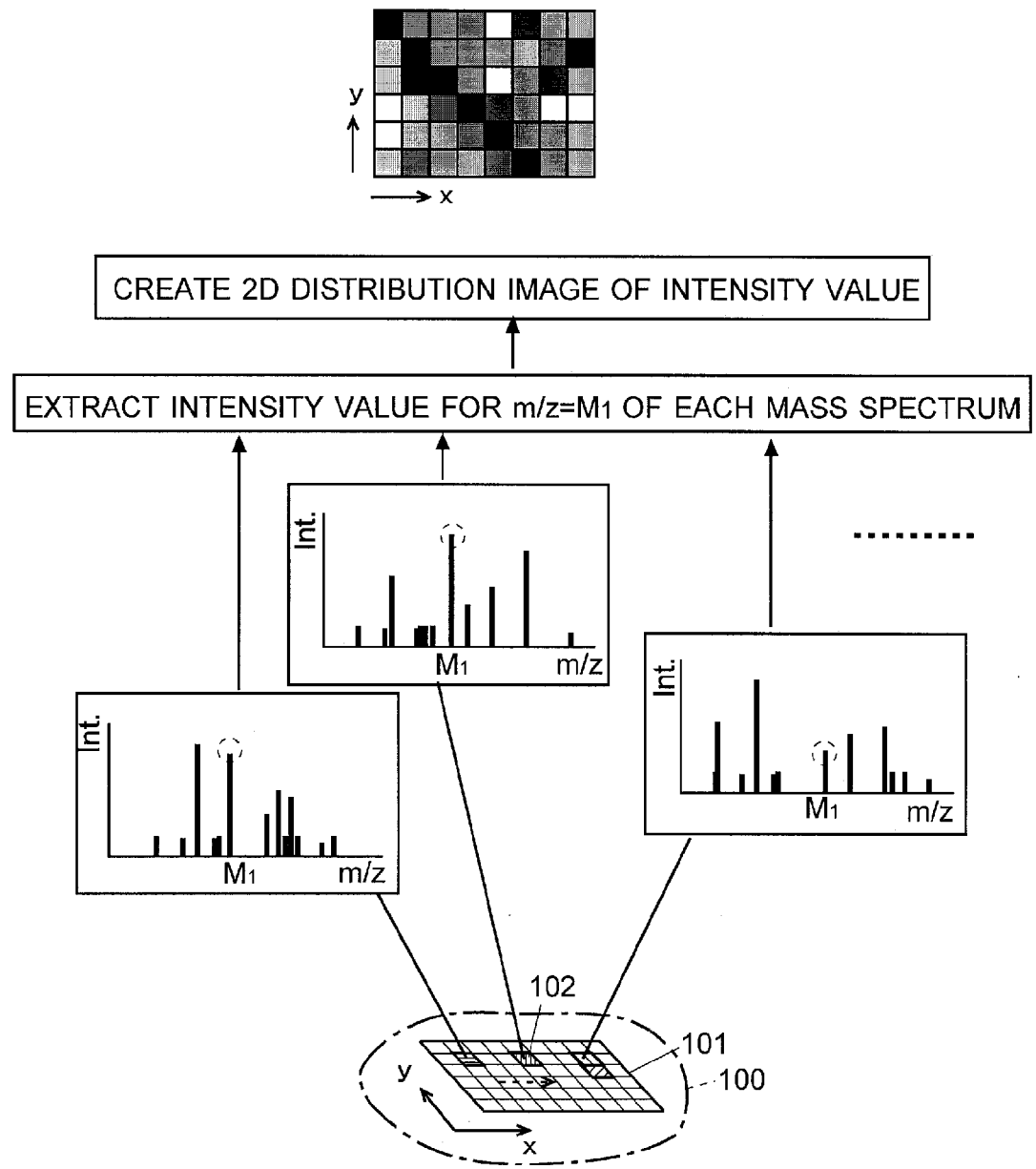

MASS ANALYSIS DATA PROCESSING METHOD AND MASS SPECTROMETER USING THE SAME

TECHNICAL FIELD

The present invention relates to a method for processing data collected by a mass analysis, and more specifically, to a data processing method suitable for an imaging mass spectrometer capable of acquiring an image showing the distribution of the signal intensity of a specific mass-to-charge ratio within a two-dimensional area on a sample (such an image is hereinafter called a "mass analysis result image"). The present invention also relates to a mass spectrometer using such a method.

BACKGROUND ART

Mass spectrometric imaging is a technique for investigating the distribution of a substance having a specific mass-to-charge ratio by performing a mass analysis on each of a plurality of micro areas within a two-dimensional area on a sample, such as a piece of biological tissue. This technique is expected to be applied, for example, in drug discoveries, biomarker discoveries, and investigation on the causes of various diseases. Mass spectrometers designed for mass spectrometric imaging are generally referred to as imaging mass spectrometers. This type of device may also be called a mass microscope since its operation normally includes the steps of performing a microscopic observation of an arbitrary area on a sample, selecting a region of interest based on the observed image, and performing an imaging mass analysis of the selected region. In the following description, the term "imaging mass spectrometer" will be used. Non-Patent Documents 1 and 2 disclose the configurations of commonly known imaging mass spectrometers and examples of analyses performed with those imaging mass spectrometers.

FIG. 9 schematically shows data obtained by performing an analysis with an imaging mass spectrometer and an image-displaying process based on the data. As shown, in an imaging mass spectrometer, an amount of mass analysis data is obtained for each of a large number of measurement points (micro areas) 102 within a two-dimensional area 101 on a sample 100. In the imaging mass spectrometers disclosed in Non-Patent Documents 1 and 2, ions originating from the sample are separated by a time-of-flight mass spectrometer according to their mass-to-charge ratio. In a system having such a configuration, a time-of-flight spectrum data showing a temporal change in the ion intensity can be obtained at each measurement point, and the time-of-flight values are converted into mass-to-charge ratios to create a mass spectrum. The spatial resolving power of the imaging mass spectrometer depends on the intervals of the measurement points 102 on the sample 100. To increase the spatial resolving power to obtain images with higher resolution, it is necessary to increase the number of measurement points 102. When a large number of measurement points 102 are set, an enormous amount of time-of-flight spectrum data will be obtained within the two-dimensional area 101 selected for the measurement.

Consider, for example, a case where a time-of-flight spectrum signal with a time range of approximately 20 msec is sampled at a sampling frequency of 1 GHz, and each sample of the signal is converted into a 16-bit digital signal. In this time-of-flight spectrum, the number of samples collected at each measurement point is approximately 20,000. Since each sample is a two-byte data, the total amount of data for one sample is approximately 40 kilobytes. If the measurement points are two-dimensionally arranged in a grid pattern of 250×250 pixels within the measurement area, the number of measurement points is 62,500, and the total amount of data obtained from the measurement area is as large as approximately 2.32 gigabytes. The total amount of data will further increase if the intervals of the measurement points are reduced to increase the number of measurement points so as to enhance the spatial resolving power, or if the two-dimensional area as the target of the measurement is enlarged. An additional increase in the total amount of data occurs when the sampling frequency for the time-of-flight spectrum signal is increased in order to improve the mass accuracy or mass-resolving power. Thus, mass spectrometric imaging data obtained with higher resolution and/or higher mass-resolving power will have larger data sizes.

To extract significant information from mass analysis data collected in the previously described manner, the spatial distribution of a mass-to-charge ratio corresponding to each peak on the mass spectrum must be visually presented to let an analysis operator interpret the significance of the data or perform an estimating process using a computer. To efficiently perform such tasks, as shown in FIG. 9, it is necessary to extract an intensity value corresponding to a specific mass-to-charge ratio (m/z=$M_1$ in the example of FIG. 9) from the mass spectrum of each measurement point 102 and visually present the two-dimensional distribution of the intensity values at high speeds. For this purpose, a mass analysis data constituting a mass spectrum or time-of-flight spectrum must be loaded in the main memory (which is normally a random access memory) of a computer.

However, when a common type of personal computer is used, it is difficult to entirely load a high-resolution mass analysis data in the main memory since there is only a limited space practically available on the main memory. One technique for handling a large-size mass analysis data that cannot be entirely loaded in the main memory is to cut a portion of the data into a small size that can be loaded in the main memory and to create an image using that portion of the data. However, in this case, it is impossible to simultaneously display and analyze the data over a large spatial area and a wide mass range. One possible method for displaying and analyzing data over a large spatial area and a wide mass range is to use a portion of an external memory device (e.g. a hard disk) as a virtual main memory, which, however, inevitably causes a significant decrease in the processing speed. Furthermore, when the analysis is aimed at comparing data of two or more samples as well as processing the data of each sample, an even greater amount of data must be loaded in and processed on the main memory. It is practically impossible to process such a large amount of data with a commonly used personal computer.

A generally used technique for handling a large amount of data on a computer is to reduce the size of data by data compression. This technique can also be applied to the aforementioned large-size mass analysis data to reduce the data size so that the entire amount of data can be handled on the main memory of a computer. However, using a data compression technique to load the entire mass analysis data in the main memory in order to create a mass analysis result data or for other purposes causes the following problems.

As the method for compressing mass analysis data constituting a mass spectrum or time-of-flight spectrum, a method using interrelations among the neighboring data points is often adopted. For example, according to the technique described in Patent Document 1, a data compression based on the run-length encoding or entropy encoding may be performed for each of the mass spectrums shown in FIG. 9, using the interrelations of a plurality of data points neighboring each other on the mass-to-charge ratio axis. This operation reduces the size of the mass analysis data for each mass spectrum, i.e. for each measurement point 102, so that the mass analysis data of all the measurement points 102 within the two-dimensional area 101 on the sample 100 can be simultaneously loaded in the main memory.

When an analysis operator wants to observe a mass analysis result image for a certain mass-to-charge ratio, it is necessary, on the computer, to extract signal intensity information of the specified mass-to-charge ratio from the mass spectrum data of each measurement point and subject the extracted information to an image-creating process. If the mass analysis data stored in the main memory is an uncompressed data, the image can be easily created by reading intensity values from the memory addresses corresponding to the mass-to-charge ratio in question and reconstructing the read values into an image. On the other hand, if the mass analysis data is an encoded, compressed data, it is impossible to immediately tell the memory addresses corresponding to the specified mass-to-charge ratio. Accordingly, it is necessary to temporarily decompress the mass spectrum data before reading the intensity values corresponding to the specified mass-to-charge ratio.

The previously described process of collecting the intensity values corresponding to a specified mass-to-charge ratio must be repeated for each of the mass spectrums obtained at the measurement points, using a long period of time. Accordingly, a considerable amount of time is consumed to display one mass analysis result image. As already noted, the task of searching an enormous number of mass analysis data of various mass-to-charge ratios for a mass-to-charge ratio having a significant spatial distribution is essential for the imaging mass analysis. If the display of the mass analysis result image requires a long time, the throughput of the search will be significantly lowered.

As is commonly known, the technical field in which data compression techniques have the longest history and widest range of applications is image processing. This is because images inherently contain relatively large amounts of data and there was a great need for sending and receiving images having large amounts of data through communication channels with limited transmission rates or via other types of media with limited capacities. For example, the aforementioned run-length encoding is used in facsimiles, which handle black-and-white binary images. Such image-related fields have also been in great need for a method for quickly finding which position in the array of the compressed data corresponds to the desired position in the array of the original (uncompressed) data. For example, in a method for compressing a bitmap image data by run-length encoding proposed in Patent Document 2, an index showing the correspondence relationship between the position in the array of the original (uncompressed) data and the position in the array of the run-length-encoded data is used to improve the speed of finding the desired position. More specifically, for each of the positions defined at regular intervals in the array of compressed image data, index information indicating which position in the original data corresponds to that position is embedded.

Such a speed-up technique using the index information is also applicable to the compression of mass analysis data. However, in the method of embedding index information in the compressed data at regular intervals, the run-length encoding (or similar compressing process) must be completed for each section separated by the indices, which results in a decrease in the data-compression efficiency. Furthermore, the compressed data with index information embedded therein cannot be correctly read by a system designed to read compressed data without expecting the presence of index information in the data. That is to say, the embedding of index information prevents some of the existing systems from maintaining lower compatibility for the processing of the compressed mass analysis data.

BACKGROUND ART DOCUMENT

Patent Document
  Patent Document 1: WO-A12009-069225
  Patent Document 2: JP-A 2007-103982
Non-Patent Document
  Non-Patent Document 1: Kiyoshi Ogawa et al., "Kenbi shitsuryou Bunseki Souchi No Kaihatsu," ("Research and Development of Mass Microscope") *Shimadzu Review*, Mar. 31, 2006, vol. 62, nos. 3.4, pp. 125-135
  Non-Patent Document 2: Takahiro Harada et al., "Kenbi shitsuryou Bunseki Souchi Ni Yoru Seitai Soshiki Bunseki," ("Biological Tissue Analysis Using Mass Microscope") *Shimadzu Review*, Apr. 24, 2008, vol. 64, nos. 3.4, pp. 139-146

SUMMARY OF THE INVENTION

Problem to be Solved by the Invention

The present invention has been developed in view of the previously described problems, and one objective thereof is to provide a mass analysis data processing method capable of compressing data of a mass analysis result image taken with high spatial resolving power and high mass-resolving power to reduce the data size of the image with a minimal loss of information, as well as being capable of high-speed reading of intensity information corresponding to an arbitrary mass-to-charge ratio or time of flight from the compressed data. Another objective of the present invention is to provide a mass analysis data processing method capable of compressing data of a mass analysis result image without compromising the data-compression efficiency from which high-speed reading of intensity information corresponding to an arbitrary mass-to-charge ratio or time of flight is possible and, even by a system that does not support the high-speed reading, necessary information can be correctly read. The present invention also provides mass spectrometers using such methods.

Means for Solving the Problems

A first aspect of the present invention aimed at solving the previously described problems is a mass analysis data processing method for processing an original spectrum data composed of a one-dimensional array of intensity information collected by a mass analysis, including:

a) a compression step, in which a compression process according to a predetermined algorithm is performed on the original spectrum data, and the thereby obtained compressed data composed of a one-dimensional array is stored in a first memory area;

b) an index information creation step, in which index information which links a position in the one-dimensional array of the original spectrum data where a piece of intensity information is present with a position in the one-dimensional array of the compressed data where a piece of compressed information corresponding to the aforementioned piece of intensity information is present is created, and the index information is stored in a second memory area separated from the first memory area; and c) an information restoration step, in which, when a command for outputting intensity information at a specific position in the one-dimensional array of the original spectrum data is given, the position where the necessary compressed information corresponding the aforementioned specific position is stored is recognized by referring to the index information in the second memory area, the necessary compressed information is read from the first memory area, and the read information is decompressed to obtain the intensity information at the aforementioned specific position.

A second aspect of the present invention is a mass analysis data processing method for processing mass analysis imaging data in which original spectrum data composed of a one-dimensional array of intensity information collected by performing a mass analysis for each of a plurality of measurement portions on a sample are linked with spatial position information of the measurement portions, including:

a) a compression step, in which the original spectrum data is compressed according to a predetermined algorithm, and the compressed data composed of a one-dimensional array is stored in a first memory area;

b) an index information creation step, in which index information which links a position in the one-dimensional array of the original spectrum data where a piece of intensity information is present with a position in the one-dimensional array of the compressed data where a piece of compressed information corresponding to the aforementioned piece of intensity information is present is created, and the index information is stored in a second memory area separated from the first memory area;

c) a position calculation step, in which, when a mass-to-charge ratio for creating a mass analysis result image is specified, a position in the one-dimensional array of the original spectrum data corresponding to the specified mass-to-charge ratio is calculated;

d) an information restoration step, in which, for each of all the measurement portions or each of a group of measurement portions within a specific range, the position where the necessary compressed information corresponding the position calculated in the position calculation step is stored is recognized by referring to the index information stored in the second memory area, the necessary compressed information is read from the first memory area, and the read information is decompressed to obtain the intensity information at the calculated position; and e) an image creation step, in which a mass analysis result image showing a two-dimensional distribution of intensity information for a desired mass-to-charge ratio is created, using the intensity information of each of the measurement portions obtained in the information restoration step and the spatial position information of these measurement portions.

In one mode of the mass analysis data processing method according to the second aspect of the present invention, the mass analysis result data is an amount of data collected with an imaging mass spectrometer having an imaging device for taking an optical microscopic image of a sample, and in the image creation step, the mass analysis result image is created by displaying intensity information for the desired mass-to-charge ratio at a corresponding position on the optical microscopic image of the sample taken with the imaging device.

In the mass analysis data processing method according to the first or second aspect of the present invention, at least a portion of the original spectrum data is compressed in a lossless manner in the compression step by run-length encoding, entropy encoding or a combination of these two encodings.

The "one-dimensional array of the original spectrum data" typically consists of intensity values respectively corresponding to different mass-to-charge ratios and arrayed in order of their mass-to-charge ratios. However, depending on the type of mass spectrometer or other factors, the intensity value may be obtained for each value of a different parameter whose value uniquely corresponds to the mass-to-charge ratio, in which case the intensity values may be arrayed in order of the value of that parameter. For example, if the mass spectrometer is a time-of-flight mass spectrometer, the one-dimensional array of the original spectrum data may be intensity values respectively obtained at different time-of-flight values and arrayed in order of the time of flight values.

As one specific mode of the mass analysis data processing method according to the first or second aspect of the present invention, the previously described steps may be performed as follows:

in the compression step, the compression process is performed in such a manner that each intensity value equal to or less than a predetermined level in the one-dimensional array of the original spectrum data is replaced with a specific value, each section where the aforementioned specific value consecutively occurs two or more times in the order of the array is replaced with a value indicating the number of consecutive occurrences of the specific value, whereas, for each sequence of intensity values except for the aforementioned specific value, a value indicating the number of intensity values forming the sequence is inserted immediately before the same sequence;

in the index information creation step, a list of items, each item including a pair of numerical values, is created as the index information, with one numerical value holding position information about the start position of the consecutive occurrence of the specific value or the start position of the sequence of intensity values except for the specific value in the one-dimensional array of the original spectrum data, and the other numerical value holding position information corresponding to the start position of the consecutive occurrence of the specific value or the start position of the sequence of intensity values except for the specific value in the one-dimensional array of the compressed data; and in the information restoration step, when the intensity value of a given position is to be obtained, the list is searched for the start position of a sequence of intensity values including the given position, and the necessary intensity value is read from the corresponding position in the array of the compressed data.

In this mode of the mass analysis data processing method, each of the intensity values equal to or less than a predetermined level (i.e. each intensity value that can be regarded as insignificant) in the one-dimensional array of the original spectrum data is replaced with a certain value (e.g. zero) in the compression step. Subsequently, the section where the intensity value of zero consecutively occurs two or more times in the order of the array of the original data is replaced with a value indicating the number of consecutive occurrences of zero, whereas, for a sequence of significant intensity values, a value indicating the number of intensity values forming the sequence is inserted immediately before the same sequence. Then, in index information creation step, the start position of each section where the intensity value of zero consecutively occurs two or more times in the one-dimensional array of the original spectrum data is paired with a position in the compressed data that corresponds to the aforementioned start position, and similarly, the start position of each sequence of data having significant intensity values in the one-dimensional array of the original spectrum data is paired with a position in the compressed data that corresponds to the aforementioned start position. The pairs created in this manner are combined into index information and stored in a memory area separated from the compressed data.

The information showing the positional relationship between the original spectrum data and the compressed data is not created at regular intervals in any of the one-dimensional arrays; the intervals vary depending on the content of the data. In other words, the creation of positional relationship information imposes no constraint on the unit (or length) of data to be compressed, and therefore makes no unfavorable effect on the compression efficiency. Since the index information is not embedded in the compressed data but stored in a memory area separated from the compressed data, it is possible restore the original spectrum data by a common decompression technique that uses only the compressed data and does not refer to the index information.

For example, in the information restoration step, necessary information can be read from the compressed data in the following manner: In the one-dimensional array of the original spectrum data, let X denote the position of a mass-to-charge ratio value, or a value of a different parameter (e.g. time of flight) corresponding to the mass-to-charge ratio value, for which the intensity value needs to be obtained. In the information restoration step, the second memory area holding the index information is accessed to select, from the list of position information of the original spectrum data, a position having the largest value among the positions whose values are smaller than X. Subsequently, letting T denote the position of a compressed data paired with the position value S selected in the index information, the compressed data held in the first memory area is accessed to read the value at position T. For example, consider the case where data values are expressed in binary form and the value (0 or 1) of the most significant bit of each data is used to determine whether the data corresponds to a sequence of an intensity value of zero or a sequence of significant intensity values. If the most significant bit of the read data value is "0", it means that zeroes consecutively occur from that point and the value of the read data indicates the number of occurrences. Accordingly, for the subsequent section consisting of the indicated number of zeroes, it is unnecessary to reconstruct the original spectrum since it has already been deduced that the intensity values within this section are all zeroes. On the other hand, if the most significant bit of the data read at position T is "1", it means that significant (non-zero) intensity values consecutively occur from that point and the value of the read data exclusive of the most significant bit indicates the number of occurrences. Therefore, the intensity value of the specified position can be retrieved at a position ahead of position T by X−S in the compressed data.

As the position X corresponding to the specified mass-to-charge ratio, a position having the closest value in the list of the index information must be searched for. This can typically be achieved by searching the list of the positions of the original spectrum data in the index information, from the first item of the list, until the first position having a value greater than X is found, and selecting the position immediately before the found position. When the original spectrum data includes a wide range of mass-to-charge ratios, or when the mass-resolving power is high, the process of searching for a value greater than X may require a considerable amount of time due to the presence of an enormous number of elements in the one-dimensional array. To confront this problem, a secondary index may be used as an auxiliary index with which the numerical value closest to position X corresponding to the specified mass-to-charge ratio in the list of the index information can be located by a simple mathematical operation.

One example of the secondary index is a table which shows, for each of a plurality of data located at predetermined data-position intervals in the one-dimensional array of the original mass spectrum, the order number of the row holding a piece of data having a value closest to the value of the concerned position among the data before the position of the concerned data (the order number of a pair of the position information in the one-dimensional array of the original spectrum data and the position information in the one-dimensional array of the compressed data) in the list of the index information.

In this case, the mass analysis data processing method according to the first or second aspect of the present invention may further include a secondary index creation step, in which a data-position interval D in the one-dimensional array of the original spectrum data is arbitrarily set and a secondary index is created by repeating the following process until the value of $D\times\chi$ exceeds the number of elements of the one-dimensional array of the original spectrum data: the value P of each of the positions in the original spectrum data held in the index information is sequentially compared with the value of $D\times\chi$, starting from the first element of the positions in the one-dimensional array, and when P exceeds $D\times\chi$ for the first time, the value of the storage position of the original spectrum data included in the immediately preceding element of the index information is written in the X-th element of the secondary index.

If the secondary index is held separately from the index information, in the information restoration step, the process of obtaining the intensity value at a predetermined position X in the original spectrum data may include the steps of: dividing a predetermined position X by the data-position interval D to obtain a quotient M; referring to the M-th element of the secondary index to obtain the position in the index information closest to the predetermined position X; reading the value W of the storage position of the original spectrum data from the obtained position in the index information; continuing this reading process in ascending order of the storage position of the original spectrum data until the read value W exceeds the value of the predetermined position X; upon occurrence of a value W that exceeds the value of the predetermined position X, reading the value at the position immediately preceding the currently read element of the storage position of the original spectrum data in the index information; setting the read value as the start position of a sequence of intensity values including the predetermined position X in the one-dimensional array of the compressed data; and reading the intensity value at the predetermined position X.

When the original spectrum data has a large number of elements and the spectrum is relatively complex, the list of the index information will have a large number of rows. Even in such a case, it is possible, with the help of the secondary index, to quickly obtain necessary position correspondence information, determine the correct portion of the compressed data corresponding to the desired portion of the original spectrum data, and obtain the intensity value of the original spectrum data. For example, this technique is effective for reducing the processing time in obtaining a desired mass analysis data or creating a mass analysis result image at a desired mass-to-charge ratio.

A third aspect of the present invention aimed at solving the previously described problems is a mass analysis data processing system using a data processing method according to the first aspect of the present invention to process an original spectrum data composed of a one-dimensional array of intensity information collected by a mass analysis, to store the processed data, to restore the original spectrum data on the basis of the stored data and to output the restored data or the result of an analysis based on the restored data in response to an instruction from a user, including:

a) a data compressor for compressing the original spectrum data according to a predetermined algorithm and for storing the compressed data composed of a one-dimensional array in a first memory area;

b) an index information creator for creating index information which links a position in the one-dimensional array of the original spectrum data where a piece of intensity information is present with a position in the one-dimensional array of the compressed data where a piece of compressed information corresponding to the aforementioned piece of intensity information is present, and for storing the index information in a second memory area separated from the first memory area; and c) an information restorer for recognizing, in response to a command for outputting intensity information at a specific position in the one-dimensional array of the original spectrum data, a storage position of the necessary compressed information corresponding the aforementioned specific position by referring to the index information in the second memory area, for reading the necessary compressed information from the first memory area, and for decompressing the read information to obtain the intensity information at the aforementioned specific position.

A fourth aspect of the present invention aimed at solving the previously described problems is a mass analysis data processing system using the data processing method according to the second aspect of the present invention to process mass analysis imaging data in which original spectrum data composed of a one-dimensional array of intensity information collected by performing a mass analysis for each of a plurality of measurement portions on a sample are linked with spatial position information of the measurement portions, to store the processed data, to restore the original spectrum data on the basis of the stored data and to output the restored data or the result of an analysis based on the restored data in response to an instruction from a user, including:

a) a data compressor for compressing the original spectrum data according to a predetermined algorithm, and for storing the compressed data composed of a one-dimensional array in a first memory area;

b) an index information creator for creating index information which links a position in the one-dimensional array of the original spectrum data where a piece of intensity information is present with a position in the one-dimensional array of the compressed data where a piece of compressed information corresponding to the aforementioned piece of intensity information is present, and for storing the index information in a second memory area separated from the first memory area;

c) a position calculator for calculating, in response to a specification of the mass-to-charge ratio of a mass analysis result image, a position in the one-dimensional array of the original spectrum data corresponding to the specified mass-to-charge ratio;

d) an information restorer for recognizing, for each of all the measurement portions or each of a group of measurement portions within a specified range, a storage position of the necessary compressed information corresponding the position calculated by the position calculator by referring to the index information stored in the second memory area, for reading the necessary compressed information from the first memory area, and for decompressing the read information to obtain the intensity information at the calculated position; and e) an image creator for creating a mass analysis result image showing a two-dimensional distribution of intensity information for a desired mass-to-charge ratio, using the intensity information of each of the measurement portions obtained with the information restorer and the spatial position information of these measurement portions.

Effect of the Invention

In the mass analysis data processing methods according to the first and second aspects of the present invention as well as the mass analysis data processing systems according to the third and fourth aspects of the present invention, there is no need to limit the length of the data to be compressed in order to create index information. Accordingly, for example, when run-length encoding is used, the encoding process can be continued without interruption throughout the run-length of each sequence of the same value in the one-dimensional array. Thus, a high level of data compression efficiency can be achieved. The index information showing the correspondence relationship between original data and compressed data is created without making any change to the compressed data. Therefore, the spectrum data can be correctly restored even by a simple process that merely compresses or decompresses data without taking into account the presence of the index information. That is to say, according to the first through fourth aspects of the present invention, it is possible to increase the data-reading speed by using the index information while maintaining the lower compatibility for the processing of the spectrum data.

BRIEF DESCRIPTION OF THE DRAWINGS

FIG. 9 is a schematic diagram illustrating the content of data obtained with an imaging mass spectrometer and a display process using the obtained data.

BEST MODE FOR CARRYING OUT THE INVENTION

One embodiment of the mass analysis data processing method according to the present invention and a mass spectrometer using this method is hereinafter described with reference to the attached drawings.

Figure 2:
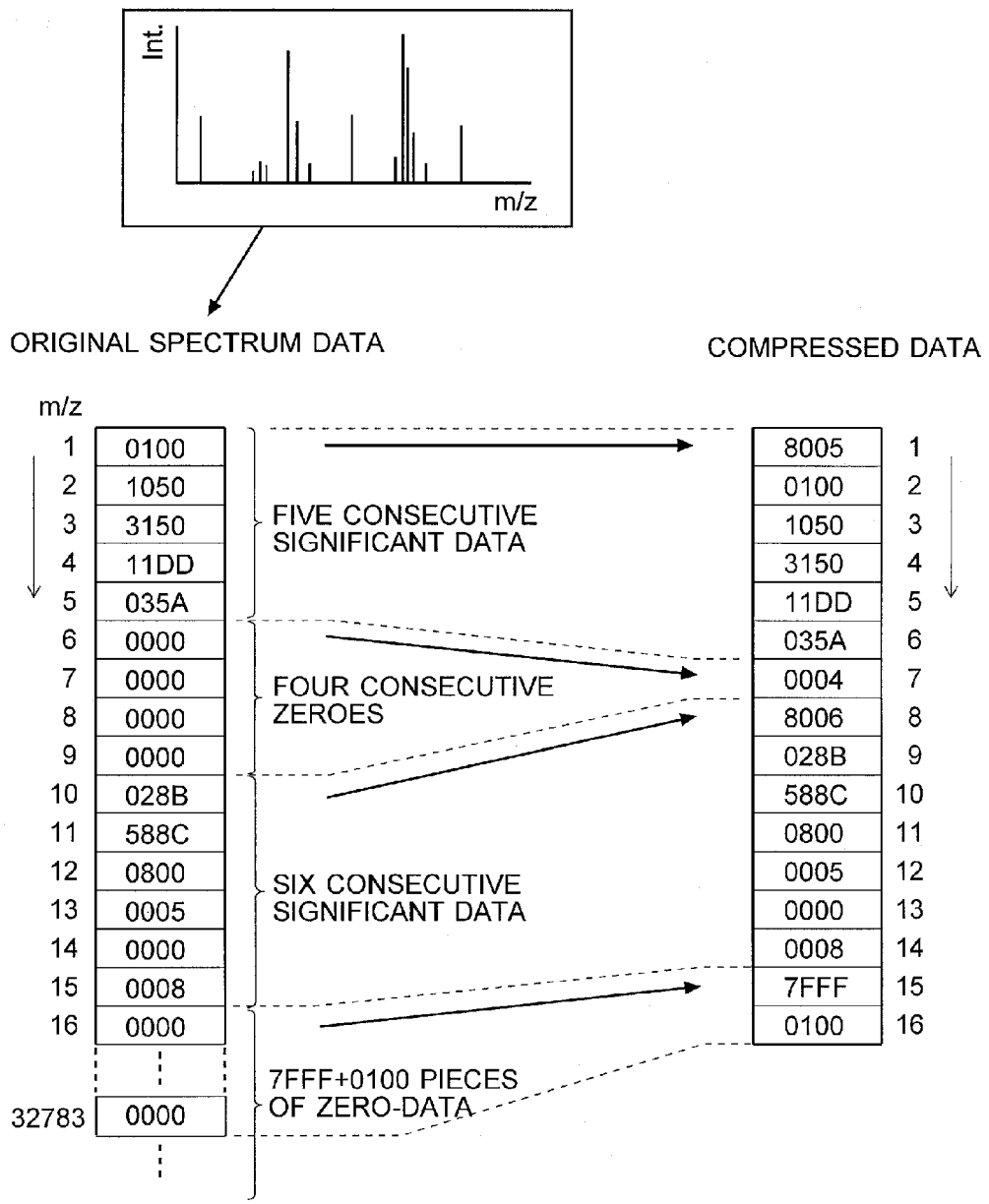
FIG. 2 is a diagram showing one example of the data compression process in the mass analysis data processing method according to one embodiment of the present invention.
Figure 3:
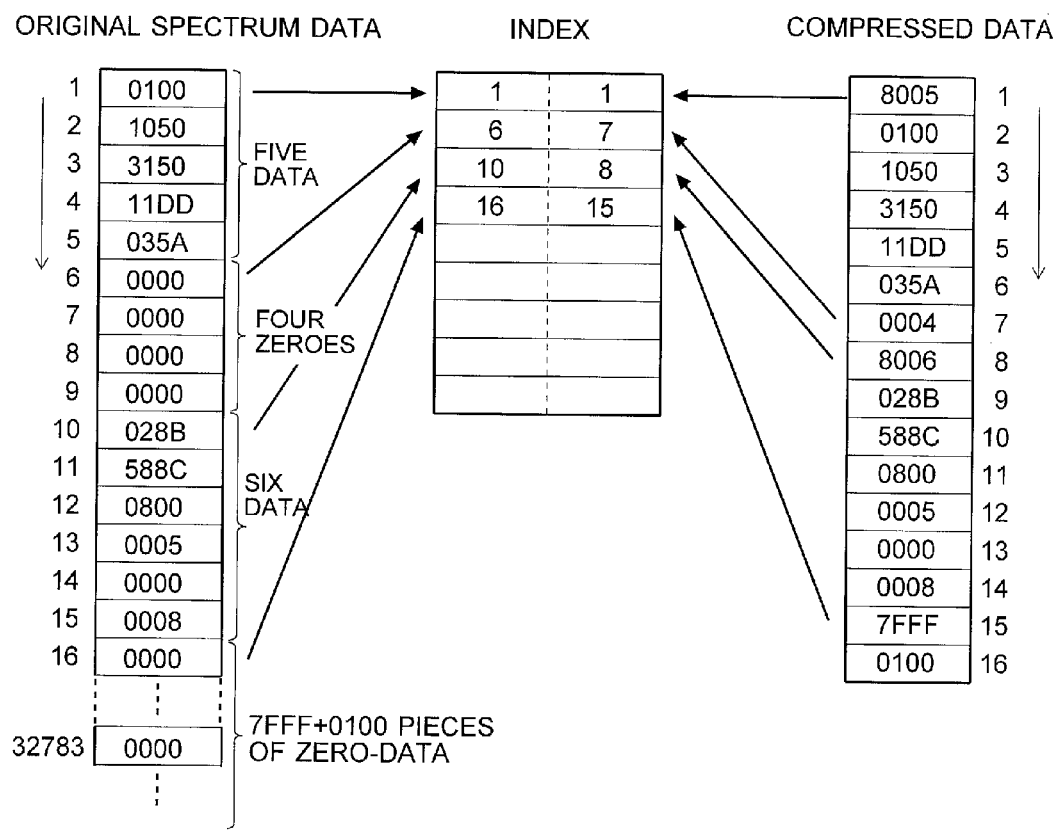
FIG. 3 is a diagram showing one example of the index creation process in the mass analysis data processing method according to the present embodiment.

Initially, a mass analysis data processing method according to one embodiment of the present invention is described with reference to FIGS. 2-5. FIG. 2 is a diagram showing one example of the data compression process in the mass analysis data processing method according to the present embodiment, and FIG. 3 is a diagram showing one example of the index creation process in the mass analysis data processing method according to the present embodiment.

The following description deals with the case of compressing a set of data for composing a mass spectrum in which the abscissa axis indicates the mass-to-charge ratio m/z and the coordinate axis indicates the signal intensity, as shown in the upper part of FIG. 2. Each piece of the spectrum data corresponding to one mass-to-charge ratio is a two-byte data. (The HEX notation is hereinafter used to show the data values. These values will be enclosed in a pair of curly brackets, { }, when they appear in this specification.) The "one-dimensional array of the original spectrum data" is a sequence of data values arrayed in ascending order of their mass-to-charge ratios. In the case of a time-of-flight mass spectrometer, a set of data composing a time-of-flight spectrum obtained by a time-of-flight mass analysis can be similarly organized in the aforementioned manner before the time-of-flight values are converted into mass-to-charge ratios.

[Compression of Original Spectrum Data]

In advance of the compression of a mass spectrum data obtained by a mass analysis, each intensity value in the one-dimensional array of the spectrum data is compared with a predetermined noise level. Any intensity value lower than the noise level is replaced with zero, while the other intensity values equal to or higher than the noise level are retained. A mass spectrum or time-of-flight spectrum usually contains a considerable amount of minor, insignificant signals due to noise in a detector or other factors, and such insignificant signals can be effectively removed by the previously described process. In the resultant spectrum, each of the sections except for the significant peaks is most likely to consist of a sequence of intensity value "zeroes."

Subsequently, the intensity values in the one-dimensional array of the original spectrum data obtained by the previous process are individually examined in ascending order of their mass-to-charge ratios. For every two or more consecutive occurrences of intensity value "zero" (expressed as {0000} in FIGS. 2 and 3), the zero sequence is replaced with a value indicating the number of consecutive occurrences of zeroes. In the present system, the maximum number of consecutive occurrences that can be handled at one time is 32,767. If the zero sequence exceeds this length, the first 32,767 zeroes are replaced by {7FFF}, and the number of remaining zeroes is stored in the next row of the array of the compressed data.

When one or more data each of which has a significant, non-zero intensity value have been found in the array of the original spectrum data, a value indicating the number of occurrences of the non-zero values is stored at the position immediately before the non-zero section in the array of the compressed data, after which the intensity values are sequentially stored. The upper limit of the number of occurrences, 32,767, also applies to this case. For a sequence that exceeds this length, the same algorithm is repeatedly used to store the number of intensity values remaining in the sequence. It should be noted that the most significant bit (MSB) of the value indicating the number of consecutive occurrences of the non-zero intensity values to be inserted immediately before the non-zero section is set to "1." This means that the numerical value indicating the number of consecutive occurrences is actually represented by 15 bits of the two-byte (16-bit) data except for the MSB. If the two-byte data indicating the number of consecutive occurrences has a nominal value of equal to or greater than 32,768 ($=2^{15}$), it can be immediately known that the two-byte data indicates the number of consecutive occurrences of non-zero intensity values, and the actual number of occurrences can be calculated by removing the MSB from the 16-bit values in the case of the binary notation, or by subtracting {8000} from the value of the two-byte data in the case of the HEX notation.

For example, the array of the original spectrum data shown in FIG. 2 starts with five significant, non-zero data values. Accordingly, a value of {8005}, with the MSB being set to "1" and the other bits indicating the number of occurrences, i.e. 5, is stored as the first element of the array of the compressed data, after which the aforementioned five values in the array of the original spectrum data are copied to the array of the compressed data. Thus, five consecutive data in the array of the original spectrum data correspond to six consecutive data in the array of the compressed data. Subsequently, four data having an intensity value of zero consecutively occur in the array of the original spectrum data. In the array of the compressed data, this zero-data sequence is represented by one data having a value of {0004}. According to such coding rules, the array of the original spectrum data is converted into the array of the compressed data. As is evident from the foregoing explanation, the present compression algorithm exhibits higher compression efficiency for an array of original spectrum data containing a larger number of consecutive occurrences of zero-intensity data.

[Creation of Index for Linking Original Spectrum Data with Compressed Data]

The "index" is a set of information representing the correspondence relationship between the positions in the array of the original spectrum data and the positions in the array of the compressed data. A specific example of the index is a list of items, with each item linking either the start position of a section in which the intensity value of zero consecutively occurs two or more times in the array of the original spectrum data, or the start position of a sequence of data having significant intensity values in the array of the original spectrum data, with the corresponding position in the array of the compressed data. For example, the sixth element of the array of the original spectrum data in FIG. 3 is linked with the seventh element of the array of the compressed data, while the tenth element of the array of the original spectrum data is linked with the eighth element of the array of the compressed data.

Figure 4:
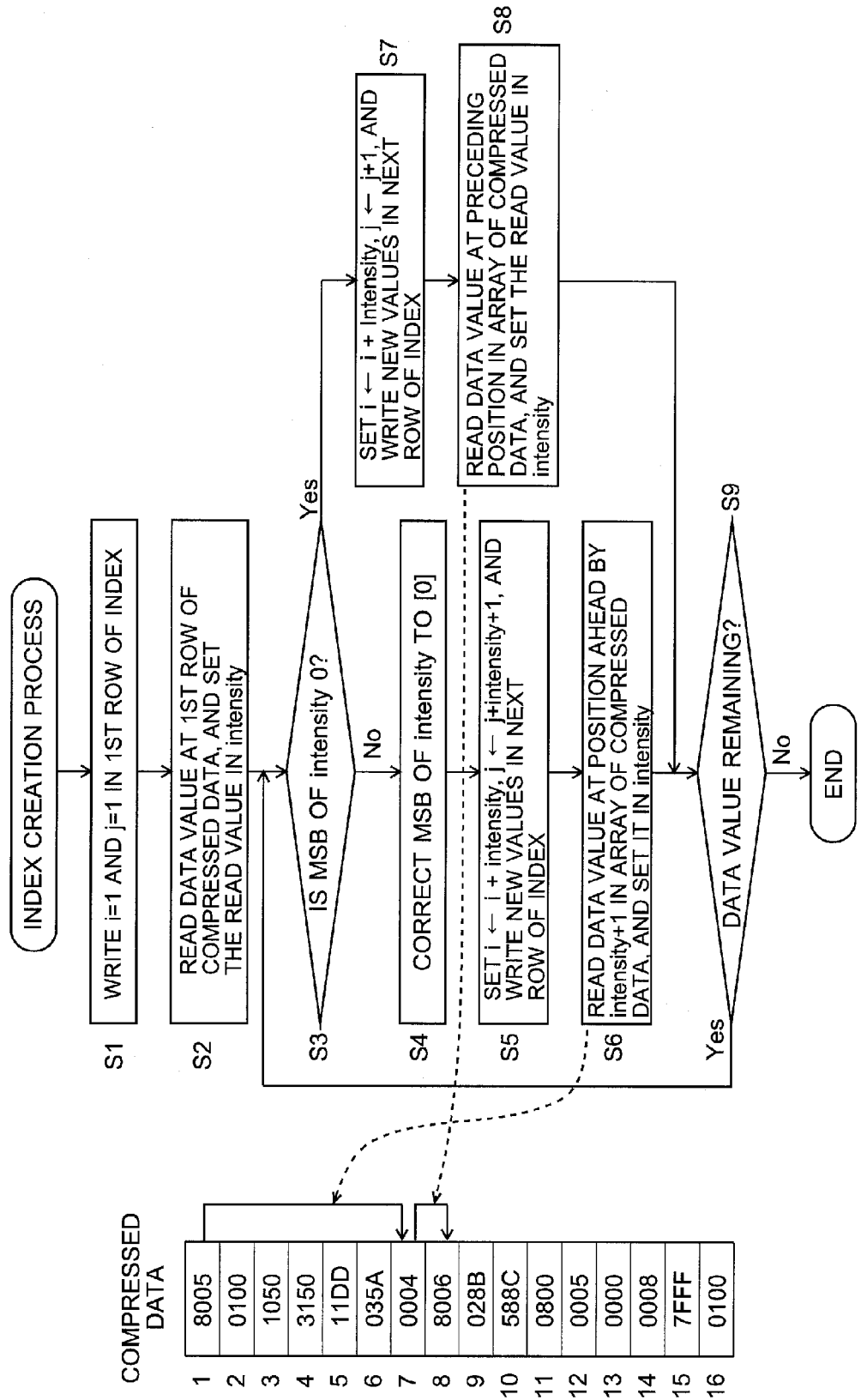
FIG. 4 is a flowchart showing a procedure for creating an index in the mass analysis data processing method according to the present embodiment.

A procedure for creating an index is shown by the flowchart of FIG. 4. The diagram in the left part of FIG. 4 illustrates how the readout point moves in the array of the compressed data in accordance with specific steps in the flowchart. In FIG. 4, i is the position in the array of the original spectrum data, j is the position in the array of the compressed data, and intensity is one data value read from the array of the compressed data.

When an array of an original spectrum data and an array of a compressed data are given and the index creation process is initiated, parameters i and j are initialized as i=1 and j=1, and these values are written in the first row of the index (Step S1). Subsequently, the data value stored at j=1 (i.e. the first row) in the array of the compressed data is set in parameter intensity (Step S2). In the example of FIG. 3, {8005} is read from the array and set in intensity.

Next, whether the MSB of intensity is "0" or not is determined (Step S3). According to the previously described compression algorithm, if MSB is "0", the data indicates the number of consecutive occurrences of zero-intensity data, and if MSB is "1", the data indicates the number of consecutive occurrences of significant data. In the example of FIG. 3, the MSB of {8005} which is set in intensity at this point is not "0." Accordingly, the operation proceeds from Step S3 to Step S4, where the MSB of intensity is replaced with "0." As a result, the value of intensity is corrected from {8005} to {0005}. Subsequently, the parameters i and j are renewed as i←i+intensity and j←j+intensity+1, and the new values of i and j are written in the next row of the index (Step S5). In the example of FIG. 3, the new values are i=1+5=6 and j=1+5+1=7, and these values are written in the second row of the index.

Subsequently, the reading point in the array of the compressed data is moved forward from the current position by intensity+1, and the data value at the new reading point is set as the new value of intensity (Step S6). In the present example, since intensity=5, the reading point is moved forward from the first element (j=1) by 6 (=intensity+1), and the data value at the seventh element (j=7) is read. If no data value is found at the new reading point ("No" in Step S9), the process will be discontinued, otherwise the operation returns to Step S3. In the previous example, after {0004} is read from the seventh data and set in intensity, the operation returns to Step S3 and further proceeds to Step S7, since the MSB of {0004} is "0." In Step S7, the parameters i and j are renewed as i←i+intensity and j←j+1, and the new values of i and j are written in the next row of the index. In the present example, the new values are i=6+4=10 and j=7+1=8, and this pair of values are written in the second row of the index.

Subsequently, the reading point in the array of the compressed data is moved forward from the current position by one, the data value at the new reading point is set in intensity (Step S8), and the operation proceeds to Step S9. In the present example, the reading point in the array of the compressed data is moved forward from the seventh element by one, and the data value of the eighth element, {8006}, is set as the new value of intensity. After Step S9, the operation returns to Step S3 and further proceeds through Steps S4 and S5 to S6 in the previously described manner. As a result, i=16 and j=15 will be written in the fourth row of the index.

By the previously described process, correspondence position information in the form of a list is obtained, where each item of the list links either the start position of a section of consecutive occurrence of zero intensity or the start position of a sequence of significant, non-zero intensity values in the array of the original spectrum data, with a position in the array of the compressed data which corresponds to the start position. This index is not always necessary to restore the original spectrum data from the compressed data. However, as will be hereinafter described, this index helps to speedily calculate the intensity value for an arbitrary mass-to-charge ratio.

[Obtaining Intensity Value for Specified Mass-to-Charge Ratio Using Index]

When the compressed data and the index are stored in a memory, an intensity value for an arbitrary mass-to-charge ratio can be obtained by performing the following process.

Figure 5:
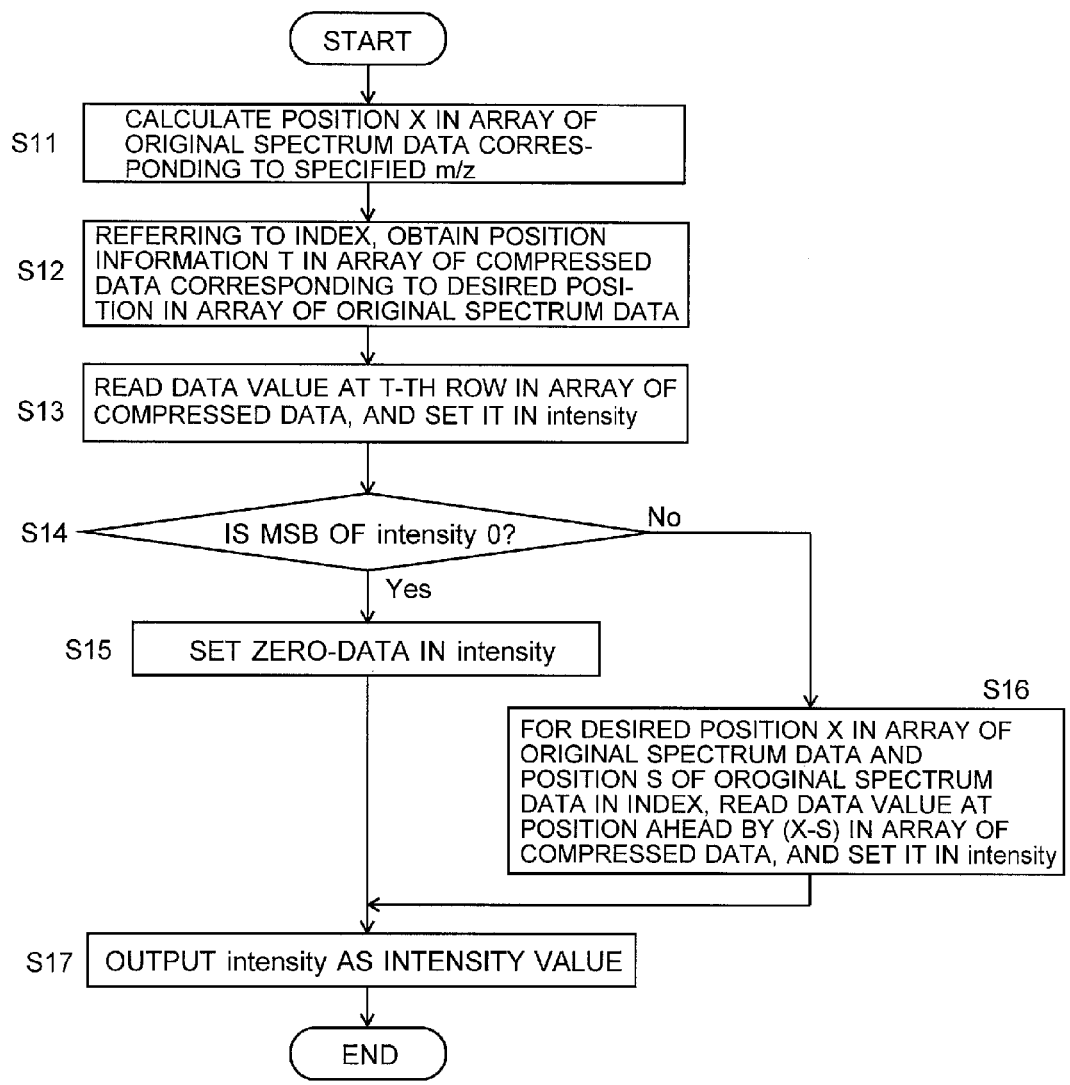
FIG. 5 is a flowchart showing a procedure for restoring original data using the index in the mass analysis data processing method according to the present embodiment.

The procedure for reading the intensity value using the index is illustrated in detail by the flowchart shown in FIG. 5.

When an arbitrary mass-to-charge ratio is specified, the position X that corresponds to the specified mass-to-charge ratio in the array of the original spectrum data is calculated (Step S11). What is actually necessary is to locate the position closest to the specified mass-to-charge ration among the elements of the one-dimensional array of the original spectrum data. Alternatively, it is possible to determine two or more positions on both sides of the specified mass-to-charge ratio, compute a weighted average of the intensity values at the determined positions, and output the computed average as the intensity value at the specified mass-to-charge ratio in the process of finally computing the intensity values.

If the elements of the one-dimensional array of the original spectrum data are not mass-to-charge ratios but time-of-flight values, the specified mass-to-charge ratio should initially be converted into a time-of-flight value by means of a mass-to-charge-ratio to time-of-flight conversion table characteristic of the mass spectrometer, and the position closest to the obtained time-of-flight value should be located.

After the position X is calculated in the previously described manner, the index is accessed to select the largest value among the values smaller than X in the list of the position information of the original data in the index. The position at which the selected value exists is denoted by S. Then, the position T in the array of the compressed data that is paired with the selected value in the index is determined (Step S12). Subsequently, the compressed data is accessed to read the data value at the T-th row and set it in intensity (Step S13).

As already explained, according to the rules of the compression algorithm adopted in the present embodiment, if the MSB of the value of a read compression data is "0", it means that the zero intensity consecutively occurs after that position a plurality of times indicated by the value of the read data. On the other hand, if the MSB of the value of a read compression data is "1", it means that significant intensity data consecutively occur after that position a plurality of times indicated by the value except for the MSB. Accordingly, whether the MSB of intensity is "0" or not is determined (Step S14). If the MSB is found to be "0", the value of intensity is replaced with zero data (Step S15), and this data is outputted as the intensity value at position X in the array of the original spectrum data corresponding to the specified mass-to-charge ratio ink (Step S17).

On the other hand, if the MSB of intensity is found to be not "0" in Step S14, the data value at the row ahead from the T-th row by (X-S) rows in the array of the compressed data is set in intensity (Step S16), and the operation proceeds to Step S17. Thus, the intensity value at position X in the array of the original mass spectrum data is obtained.

[Configuration and Operation of Mass Spectrometer]

Figure 1:
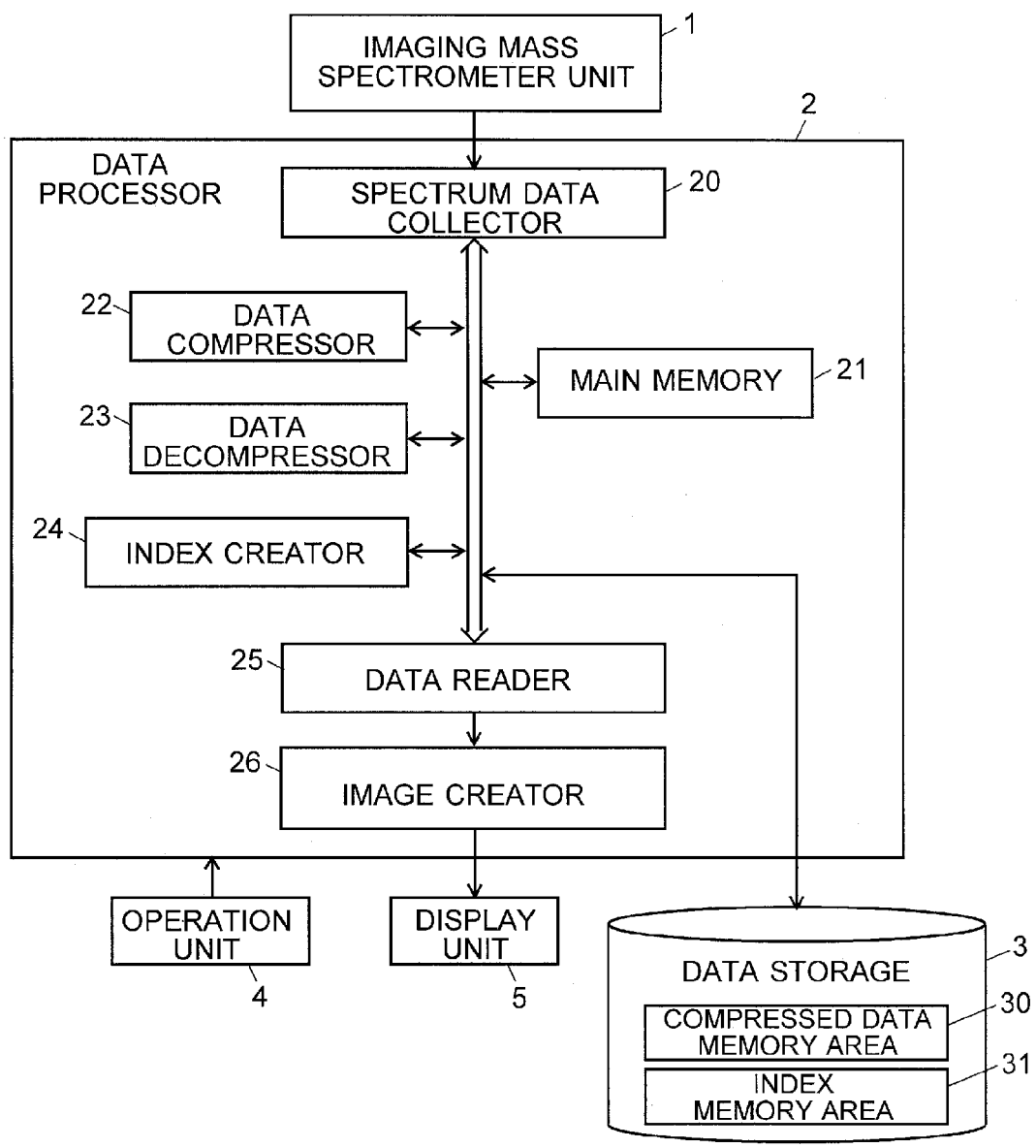
FIG. 1 is a schematic configuration diagram showing one embodiment of the mass spectrometer for carrying out the mass analysis data processing method according to the present invention.

FIG. 1 is a block diagram showing one embodiment of an imaging mass spectrometer for carrying out the previously described mass analysis data processing method. This mass spectrometer includes an imaging mass spectrometer unit 1 for performing a two-dimensional mass analysis of a sample as described with reference FIG. 9 to obtain mass spectrum data for each measurement point, a data processor 2 for performing the previously described mass analysis data processing method, a data storage 3 for storing data compressed by the data processor 2 and index, an operation unit 4 to be operated by a user, and a display unit 5 for displaying analysis results or other information. The data processor 2 is actually a personal computer including a central processing unit (CPU), random access memory (RAM), read only memory (ROM) and other components, and from a functional point of view, it includes a spectrum data collector 22, a main memory 21, a data compressor 22, a data decompressor 23, an index creator 24, a data reader 25, an image creator 26 and other functional blocks. The data storage 3 has two separate memory areas, i.e. a compression data memory area 30 for storing a compressed data and an index memory area 31 for storing an index.

The spectrum data collector 20 reads mass spectrum data obtained by mass analysis in an imaging mass spectrometer unit 1 and temporarily stores the data in an external auxiliary storage device (such as a hard disk, which is not shown) or in an area of the data storage 3 other than the aforementioned memory area 30 and 31. The data compressor 22 compresses each of the mass spectrum data corresponding to the measurement points according to the previously described algorithm and stores the compressed data in the compressed data memory area 30. The index creator 24 creates an index for each measurement point according to the previously described process steps, using the mass spectrum data (original spectrum data) and the compressed data, and stores the index in the index memory area 31 of the data storage 3.

The index is created for each pair of the array of the mass spectrum data (original spectrum data) and the array of the compressed spectrum data. Therefore, the same number of indices as the measurement points will be created. After the compressed data and indices for the entire group of mass spectrum data collected by mass analysis are stored in the data storage 3, the original mass spectrum data are discarded because they are no longer necessary.

When a user wants to display a mass analysis result image using the data stored in the data storage 3, the user specifies the value of a desired mass-to-charge ratio on the mass spectrum and enters a command through the operation unit 4. Upon receiving this command, the data reader 25 reads necessary compressed data and indices from the data storage 3 into the main memory 21. The data decompressor 23 calculates, for each measurement point, the intensity value corresponding to the specified mass-to-charge ratio according to the previously described process steps. In the present embodiment, since lossless run-length encoding is used for data compression, the same intensity values as in the original spectrum data can be restored from the compressed data. The image creator 26 creates a mass analysis result image for the specified mass-to-charge ratio by two-dimensionally arranging the intensity values respectively obtained for the measurement points. The created image is displayed on the screen of the display unit 5.

As already stated, the use of the index enables the system to speedily obtain the intensity value of the desired mass-to-charge ratio and thereby quickly display a mass analysis result image. The index is stored in the index memory area 31, which is completely separated from the compressed data memory area 30. Therefore, although this requires a longer processing time, it is possible to separately read and decompress the compressed data by a conventional data decompression method without using the index so as to determine the intensity value corresponding to the desired mass-to-charge ratio, create a mass analysis result image and display the created image. Accordingly, even a system that does not use the index in the data restoration process can display a mass analysis result image using the data stored in the data storage 3.

[Another Embodiment of Mass Analysis Data Processing Method]

The number of elements of the array of the original spectrum data will increase when the mass spectrum data is collected over a wide area of mass-to-charge ratios or with a high mass-resolving power. Furthermore, when the obtained spectrum is complex, the index will also be complex (with a large number of rows), which may possibly result in a long period of time required for the search using the index. In such cases, using a secondary index which helps to refer to the primary index is effective to reduce the search time. One embodiment using a secondary index in addition to the primary index is hereinafter described with reference to FIGS. 6-8.

Figure 6:
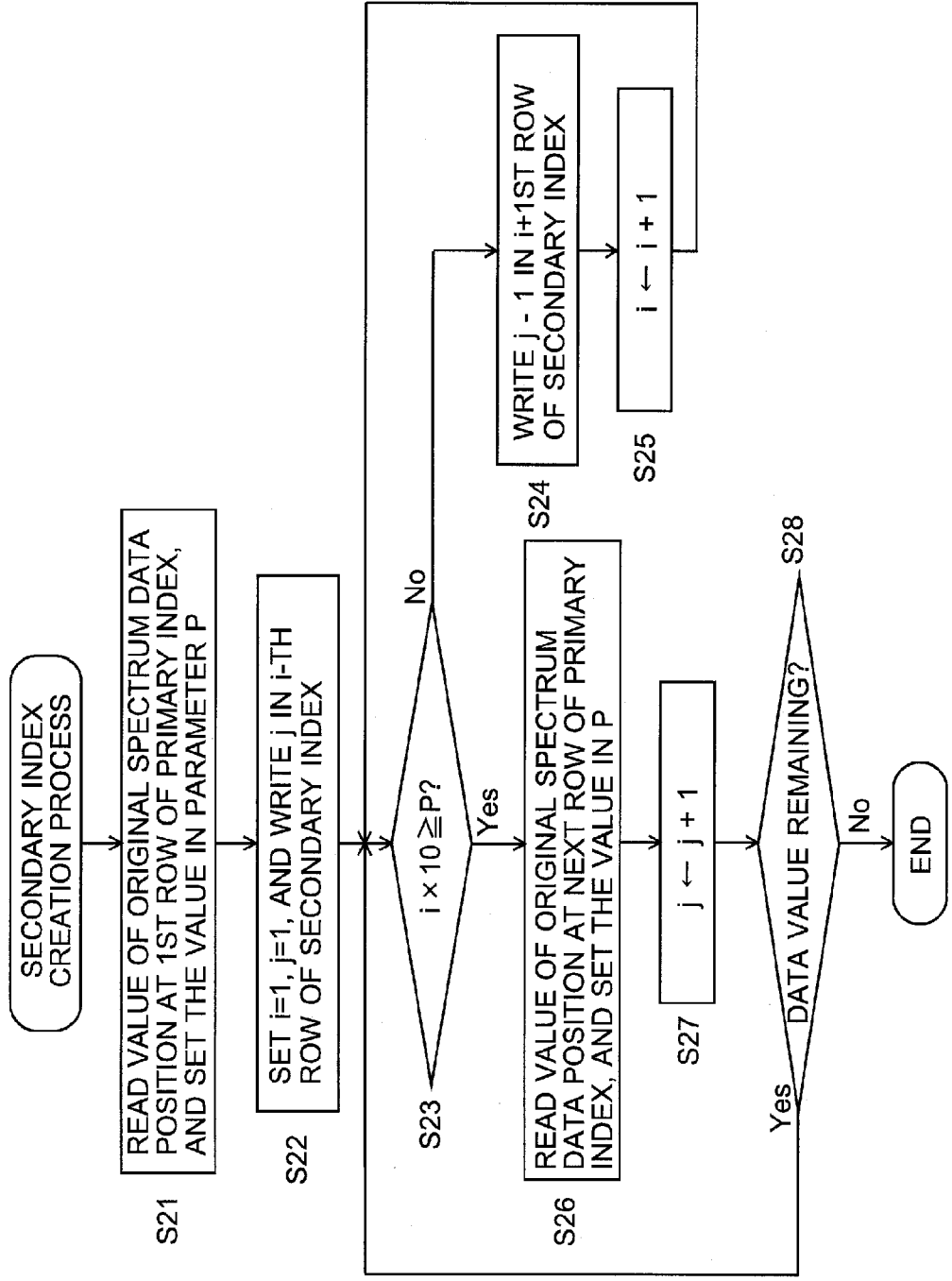
FIG. 6 is a flowchart showing a procedure for creating a secondary index in the mass analysis data processing method according to another (second) embodiment of the present invention.
Figure 7:
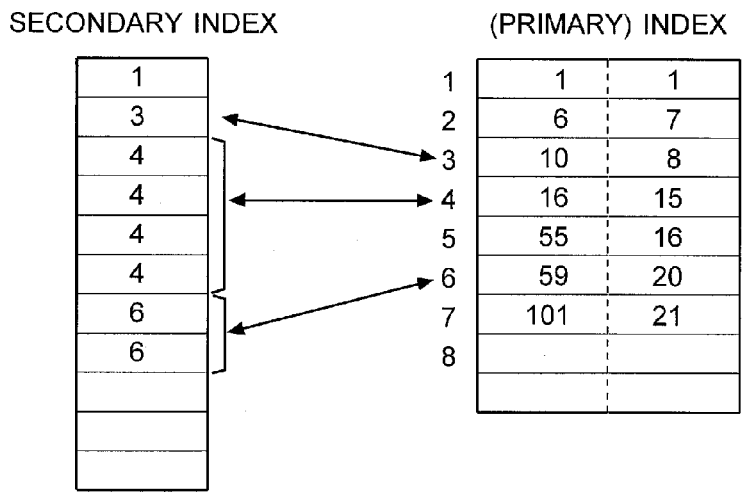
FIG. 7 is a flowchart showing an example of the secondary index in the mass analysis data processing method according to the second embodiment.
Figure 8:
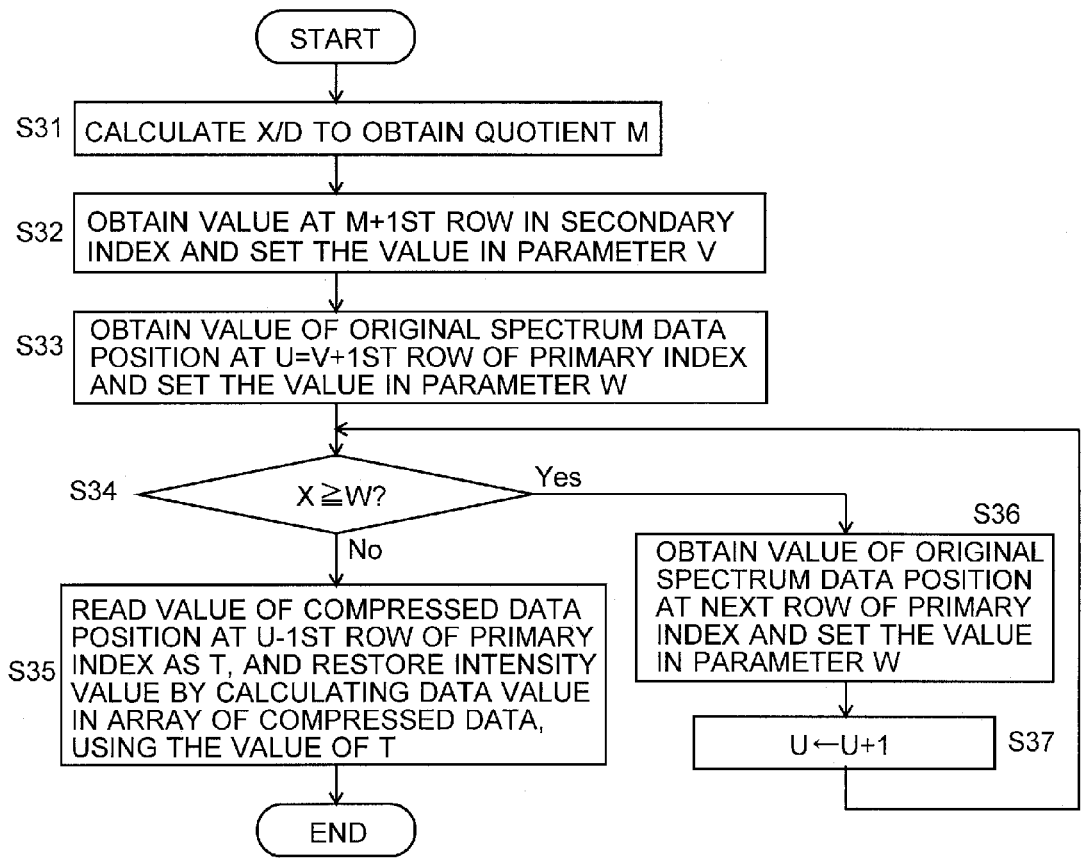
FIG. 8 is a flowchart showing a procedure for restoring original data using the secondary index in the mass analysis data processing method according to the second embodiment.

FIG. 6 is a flowchart showing a procedure for creating the secondary index, FIG. 7 is a flowchart showing an example of the secondary index for an index created from the data shown in FIG. 3, and FIG. 8 is a flowchart showing a procedure for reading intensity values using the secondary index.

With reference to FIGS. 6 and 7, the procedure for creating the secondary index, which is performed after the creation of the primary index, is hereinafter described. In FIG. 6, parameter i indicates the position (row) in the secondary index, and parameter/indicates the position in the array of the original spectrum data. In the process of creating the secondary index, an appropriate data-position interval D should be previously set. In the following example, D=10.

When the secondary index creation process is initiated, the value of the original spectrum data position at the first row of the primary index is set in parameter P (Step S21). In the example of FIG. 7, P=1. Next, parameters i and j are initialized as i=1 and j=1, and the value of j is written in the i-th row of the secondary index (Step S22). In the present case, as shown in FIG. 7, the value 1 is written in the first row of the secondary index.

Subsequently, whether the value of i×D (i.e. i×10 in the present example) is equal to or greater than P is determined (Step S23). When i=1 and P=1, the result of determination in Step S23 will be "Yes" and the operation will proceed to Step S26, where the value of the original spectrum data position at the next row of the primary index is set in P. Subsequently, j is incremented by one (Step S27). In the example of FIG. 7, the value of the original spectrum data position at the second row of the primary index is 6, so that P=6 and j=2. If the primary index has no unread value remaining, the result of determination in Step S28 will be "No" and the process will be discontinued. If one or more data values remain unread in the primary index, the operation returns to Step S23. When i=1 and P=6, the result of determination in Step S23 will once more be "Yes", so that the operation proceeds through Steps S26 and S27 to S28 in the previously described manner. In the example of FIG. 7, the value of the original spectrum data position at the third row of the primary index is read in Step S26, yielding P=10 and j=3. After Step S28, the operation returns to Step S23.

With i=1 and P=10, the result of determination in Step S23 will once more be "Yes", so that the operation proceeds through Steps S26 and S27 to S28. In the example of FIG. 7, the value of the original spectrum data position at the fourth row of the primary index is read in Step S26, yielding P=16 and j=4. After Step S28, the operation returns to Step S23. This time, since i=1 and P=16, the result of determination in Step S23 will be "No", so that j−1 is written in the i+1st row of the secondary index (Step S24). In the case of i=1 and j=4, j−1=3 is written in the second row of the secondary index. Subsequently, i is incremented by one (Step S25), and the operation returns to Step S23.

Thus, in the process shown in FIG. 6, each of the values of the original spectrum data position is sequentially read from the first row of the primary index and compared with i×D, i.e. the product of the order number (i) of the row selected as the writing point in the secondary index and the data-position interval D. When the value read from the primary index has exceeded i×D for the first time, the position information at the row preceding the current reading point in the primary index is written in the i+1st row of the secondary index. By performing these operations through to the last row of the primary index, the secondary index is completed. The value of D may be arbitrarily set. Increasing the value of D makes the secondary index less detailed, causing the index search to take a longer time. However, since the total amount of data including the indices decreases, the compression efficiency will be higher.

The process of restoring data using the secondary index is hereinafter described with reference to FIG. 8.

When a mass-to-charge ratio (time of flight, or the like) of interest is specified and the corresponding position X in the array of the original spectrum data is determined, X is divided by the data-position interval D to obtain quotient M (Step S31). Subsequently, the secondary index is accessed to read the numerical value stored in the M+1st row and set the value in parameter V (Step S32). Referring to FIGS. 3 and 7, consider the case where the intensity value at the $12^{th}$ row of the array of the original spectrum data, i.e. {0800}, needs to be obtained. Dividing X=12 by D=10 yields M=1. Accordingly, the value at the second row of the secondary index is read as V=3.

Next, the value of the original spectrum data position stored in the U=V+1st row of the primary index is set in parameter W (Step S33), and W is compared with X (Step S34). If X is less than W, the compressed data position stored in the U−1st row of the primary index is set in W (Step S35). Then, the data value at the W-th row of the array of the compressed data is read, and the data restoration process using the data values at the W-th and subsequent rows is performed in the previously described manner.

For example, in the case of V=3, the value of the original spectrum data position stored in the fourth row of the primary index is 16, so that W=16 and X=12. With these values, the result of determination in Step S34 will be "No." Accordingly, the value of the compressed data position stored in the U−1st row (i.e. the third row) of the primary index, i.e. 8, is read, and this value is set as T=8. Then, in the array of the compressed data, the eighth value {8006} is read, and the previously described data restoration process is performed to obtain an intensity value of {0800}.

On the other hand, if X is equal to or greater than W, the value of the original spectrum data position at the next row of the primary index is read as the value of W (Step S36), and after U is incremented by one (Step S37), the operation returns to Step S34. The process of Steps S34, S36 and S37 is repeated until the value of the original spectrum data position exceeds X. When the value of the original spectrum data position has exceeded X, the numerical value of the compressed data position paired with the value stored in the row preceding the current original spectrum data position is read, after which the data restoration process is performed in the previously described manner.

Thus, the use of the secondary index enables quick access to necessary information in the primary index, whereby the data restoration using the primary index can be performed at high speeds. Each secondary index is associated with one specific primary index. Therefore, in actual systems, the two indices may be stored in the same memory area.

Although any of the previous embodiments used run-length encoding for data compression, the foregoing explanations are also applicable to a system using entropy encoding for data compression.

It should be noted that the previous embodiments are mere examples of the present invention. Any change, modification or addition appropriately made within the spirit of the present invention from any viewpoints other than the previously described ones will naturally fall within the scope of claims of the present patent application.

EXPLANATION OF NUMERALS

1 . . . Imaging Mass Spectrometer Unit
2 . . . Data Processor
20 . . . Spectrum Data Collector
21 . . . Main Memory
22 . . . Data Compressor
23 . . . Data Decompressor
24 . . . Index Creator
25 . . . Data Reader
26 . . . Image Creator
3 . . . Data Storage
30 . . . Compressed Data Memory Area
31 . . . Index Memory Area
4 . . . Operation Unit
5 . . . Display Unit

The invention claimed is:

1. A mass analysis data processing method for processing an original spectrum data composed of a one-dimensional array of intensity information collected by a mass analysis, comprising:
   a compression step, in which a compression process according to a predetermined algorithm is performed on the original spectrum data, and a thereby obtained compressed data composed of a one-dimensional array is stored in a first memory area;
   an index information creation step, in which index information which links a position in the one-dimensional array of the original spectrum data where a piece of intensity information is present with a position in the one-dimensional array of the compressed data where a piece of compressed information corresponding to the aforementioned piece of intensity information is present is created, and the index information is stored in a second memory area separated from the first memory area; and
   an information restoration step, in which, when a command for outputting intensity information at a specific position in the one-dimensional array of the original spectrum data is given, a storage position of the necessary compressed information corresponding the aforementioned specific position is recognized by referring to the index information in the second memory area, the necessary compressed information is read from the first memory area, and the read information is decompressed to obtain the intensity information at the aforementioned specific position.

2. The mass analysis data processing method according to claim 1, wherein at least a portion of the original spectrum data is compressed in a lossless manner in the compression step by run-length encoding, entropy encoding or a combination of these two encodings.

3. The mass analysis data processing method according to claim 2, wherein: in the compression step, the compression process is performed in such a manner that each intensity value equal to or less than a predetermined level in the one-dimensional array of the original spectrum data is replaced with a specific value, each section where the aforementioned specific value consecutively occurs two or more times in the order of the array is replaced with a value indicating a number of consecutive occurrences of the specific value, whereas, for each sequence of intensity values except for the aforementioned specific value, a value indicating a number of intensity values forming the sequence is inserted immediately before the same sequence; in the index information creation step, a list of items, each item including a pair of numerical values, is created as the index information, with one numerical value holding position information about a start position of the consecutive occurrence of the specific value or a start position of the sequence of intensity values except for the specific value in the one-dimensional array of the original spectrum data, and the other numerical value holding position information corresponding to a start position of the consecutive occurrence of the specific value or a start position of the sequence of intensity values except for the specific value in the one-dimensional array of the compressed data; and in the information restoration step, when the intensity value of a given position is to be obtained, the list is searched for the start position of a sequence of intensity values including the given position, and the necessary intensity value is read from the corresponding position in the array of the compressed data.

4. The mass analysis data processing method according to claim 1, further comprising a secondary index creation step, in which a secondary index is created, the secondary index showing, for each of a plurality of data located at predetermined data-position intervals in the one-dimensional array of the original mass spectrum, an order number of a row holding a piece of data having a value closest to the value of the concerned position among the data before the position of the concerned data in the list of the index information.

5. The mass analysis data processing method according to claim 4, wherein the secondary index creation step is performed in such a manner that a data-position interval D in the one-dimensional array of the original spectrum data is arbitrarily set and the secondary index is created by repeating a following process until a value of D×χ exceeds a number of elements of the one-dimensional array of the original spectrum data: a value P of each of the positions in the original spectrum data held in the index information is sequentially compared with the value of D×χ, starting from a first element of the positions in the one-dimensional array, and when P exceeds D×χ for the first time, a value of the storage position of the original spectrum data included in an immediately preceding element of the index information is written in an X-th element of the secondary index.

6. The mass analysis data processing method according to claim 5, wherein, in the information restoration step, a process of obtaining the intensity value at a predetermined position X in the original spectrum data includes steps of: dividing a predetermined position X by the data-position interval D to obtain a quotient M; referring to an M-th element of the secondary index to obtain a position in the index information closest to the predetermined position X; reading a value W of the storage position of the original spectrum data from the obtained position in the index information; continuing this reading process in ascending order of the storage position of the original spectrum data until the read value W exceeds the value of the predetermined position X; upon occurrence of a value W that exceeds the value of the predetermined position X, reading the value at a position immediately preceding the currently read element of the storage position of the original spectrum data in the index information; setting the read value as the start position of a sequence of intensity values including the predetermined position X in the one-dimensional array of the compressed data; and reading the intensity value at the predetermined position X.

7. A mass analysis data processing method for processing mass analysis imaging data in which original spectrum data composed of a one-dimensional array of intensity information collected by performing a mass analysis for each of a plurality of measurement portions on a sample are linked with spatial position information of the measurement portions, comprising:

a compression step, in which the original spectrum data is compressed according to a predetermined algorithm, and a thereby obtained compressed data composed of a one-dimensional array is stored in a first memory area;

an index information creation step, in which index information which links a position in the one-dimensional array of the original spectrum data where a piece of intensity information is present with a position in the one-dimensional array of the compressed data where a piece of compressed information corresponding to the aforementioned piece of intensity information is present is created, and the index information is stored in a second memory area separated from the first memory area;

a position calculation step, in which, when a mass-to-charge ratio for creating a mass analysis result image is specified, a position in the one-dimensional array of the original spectrum data corresponding to the specified mass-to-charge ratio is calculated;

an information restoration step, in which, for each of all measurement portions or each of a group of measurement portions within a specific range, a storage position of the necessary compressed information corresponding the position calculated in the position calculation step is recognized by referring to the index information stored in the second memory area, the necessary compressed information is read from the first memory area, and the read information is decompressed to obtain the intensity information at the calculated position; and an image creation step, in which a mass analysis result image showing a two-dimensional distribution of intensity information for a desired mass-to-charge ratio is created, using the intensity information of each of the measurement portions obtained in the information restoration step and the spatial position information of these measurement portions.

8. The mass analysis data processing method according to claim 7, wherein: the mass analysis result data is an amount of data collected with an imaging mass spectrometer having an imaging device for taking an optical microscopic image of a sample; and in the image creation step, the mass analysis result image is created by displaying intensity information for the desired mass-to-charge ratio at a corresponding position on the optical microscopic image of the sample taken with the imaging device.

9. The mass analysis data processing method according to claim 7, wherein at least a portion of the original spectrum data is compressed in a lossless manner in the compression step by run-length encoding, entropy encoding or a combination of these two encodings.

10. The mass analysis data processing method according to claim 9, wherein: in the compression step, the compression process is performed in such a manner that each intensity value equal to or less than a predetermined level in the one-dimensional array of the original spectrum data is replaced with a specific value, each section where the aforementioned specific value consecutively occurs two or more times in the order of the array is replaced with a value indicating a number of consecutive occurrences of the specific value, whereas, for each sequence of intensity values except for the aforementioned specific value, a value indicating a number of intensity values forming the sequence is inserted immediately before the same sequence; in the index information creation step, a list of items, each item including a pair of numerical values, is created as the index information, with one numerical value holding position information about a start position of the consecutive occurrence of the specific value or a start position of the sequence of intensity values except for the specific value in the one-dimensional array of the original spectrum data, and the other numerical value holding position information corresponding to a start position of the consecutive occurrence of the specific value or a start position of the sequence of intensity values except for the specific value in the one-dimensional array of the compressed data; and in the information restoration step, when the intensity value of a given position is to be obtained, the list is searched for the start position of a sequence of intensity values including the given position, and the necessary intensity value is read from the corresponding position in the array of the compressed data.

11. The mass analysis data processing method according to claim 7, further comprising a secondary index creation step, in which a secondary index is created, the secondary index showing, for each of a plurality of data located at predetermined data-position intervals in the one-dimensional array of the original mass spectrum, an order number of a row holding a piece of data having a value closest to the value of the concerned position among the data before the position of the concerned data in the list of the index information.

12. The mass analysis data processing method according to claim 11, wherein the secondary index creation step is performed in such a manner that a data-position interval D in the one-dimensional array of the original spectrum data is arbitrarily set and the secondary index is created by repeating a following process until a value of $D \times \chi$ exceeds a number of elements of the one-dimensional array of the original spectrum data: a value P of each of the positions in the original spectrum data held in the index information is sequentially compared with the value of $D \times \chi$, starting from a first element of the positions in the one-dimensional array, and when P exceeds $D \times \chi$ for the first time, a value of the storage position of the original spectrum data included in an immediately preceding element of the index information is written in an X-th element of the secondary index.

13. The mass analysis data processing method according to claim 12, wherein, in the information restoration step, a process of obtaining the intensity value at a predetermined position X in the original spectrum data includes steps of dividing a predetermined position X by the data-position interval D to obtain a quotient M; referring to an M-th element of the secondary index to obtain a position in the index information closest to the predetermined position X; reading a value W of the storage position of the original spectrum data from the obtained position in the index information; continuing this reading process in ascending order of the storage position of the original spectrum data until the read value W exceeds the value of the predetermined position X; upon occurrence of a value W that exceeds the value of the predetermined position X, reading the value at a position immediately preceding the currently read element of the storage position of the original spectrum data in the index information; setting the read value as the start position of a sequence of intensity values including the predetermined position X in the one-dimensional array of the compressed data; and reading the intensity value at the predetermined position X.

14. A mass analysis data processing system for processing an original spectrum data composed of a one-dimensional array of intensity information collected by a mass analysis, for storing the processed data, and for restoring the original spectrum data on a basis of the stored data and outputting the restored data or a result of an analysis based on the restored data in response to an instruction from a user, comprising:
a data storage unit having at least a first memory area and a second memory area
a data compressor for compressing the original spectrum data according to a predetermined algorithm and for storing the compressed data composed of a one-dimensional array in the first memory area;
an index information creator for creating index information which links a position in the one-dimensional array of the original spectrum data where a piece of intensity information is present with a position in the one-dimensional array of the compressed data where a piece of compressed information corresponding to the aforementioned piece of intensity information is present, and for storing the index information in the second memory area separated from the first memory area;
an information restorer for recognizing, in response to a command for outputting intensity information at a specific position in the one-dimensional array of the original spectrum data, a storage position of the necessary compressed information corresponding the aforementioned specific position by referring to the index information in the second memory area, for reading the necessary compressed information from the first memory area, and for decompressing the read information to obtain the intensity information at the aforementioned specific position.

15. A mass analysis data processing system for processing mass analysis imaging data in which original spectrum data composed of a one-dimensional array of intensity information collected by performing a mass analysis for each of a plurality of measurement portions on a sample are linked with spatial position information of the measurement portions, for storing the processed data, and for restoring the original spectrum data on a basis of the stored data and outputting the restored data or a result of an analysis based on the restored data in response to an instruction from a user, comprising:
a data storage unit having at least a first memory area and a second memory area
a data compressor for compressing the original spectrum data according to a predetermined algorithm, and for storing the compressed data composed of a one-dimensional array in the first memory area;
an index information creator for creating index information which links a position in the one-dimensional array of the original spectrum data where a piece of intensity information is present with a position in the one-dimensional array of the compressed data where a piece of compressed information corresponding to the aforementioned piece of intensity information is present, and for storing the index information in the second memory area separated from the first memory area;
a position calculator for calculating, in response to a specification of the mass-to-charge ratio of a mass analysis result image, a position in the one-dimensional array of the original spectrum data corresponding to the specified mass-to-charge ratio;
an information restorer for recognizing, for each of all the measurement portions or each of a group of measurement portions within a specified range, a storage position of the necessary compressed information corresponding the position calculated by the position calculator by referring to the index information stored in the second memory area, for reading the necessary compressed information from the first memory area, and for decompressing the read information to obtain the intensity information at the calculated position; and
an image creator for creating a mass analysis result image showing a two-dimensional distribution of intensity information for a desired mass-to-charge ratio, using the intensity information of each of the measurement portions obtained with the information restorer and the spatial position information of these measurement portions.

* * * * *